United States Patent
Homma et al.

(10) Patent No.: US 8,493,059 B2
(45) Date of Patent: Jul. 23, 2013

(54) SHUNT SENSOR AND SHUNT SENSOR ASSEMBLY

(75) Inventors: Wolfhard J. Homma, Mission Viejo, CA (US); Carlos A. Laiz, Irvine, CA (US); Kourosh Boutorabi, Tustin, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 512 days.

(21) Appl. No.: 12/772,034

(22) Filed: Apr. 30, 2010

(65) Prior Publication Data

US 2011/0267038 A1 Nov. 3, 2011

(51) Int. Cl.
   *G01R 1/20* (2006.01)
(52) U.S. Cl.
   USPC .......... 324/126; 324/117 H; 324/117 R; 324/127
(58) Field of Classification Search
   USPC .......... 324/126, 338, 117 H, 117 R, 127
   See application file for complete search history.

(56) References Cited

U.S. PATENT DOCUMENTS

| 2003/0033885 A1* | 2/2003 | Knox et al. ............. 73/777 |
| 2011/0089931 A1* | 4/2011 | Podlisk et al. ............. 324/126 |

* cited by examiner

*Primary Examiner* — Jermele M Hollington
*Assistant Examiner* — Son Le

(57) ABSTRACT

The present disclosure describes configurations for current shunt sensors and current shunt sensor assemblies having improved electromagnetic cross-talk rejection that can be used in single-phase/split-phase and poly-phase power metering applications. Some embodiments of the current shunt sensors and current shunt sensor assemblies reduce the need for a shielding material around current shunt sensors in single-phase/split-phase and poly-phase power metering applications. Some embodiments of the current shunt sensors achieve improved electromagnetic cross-talk rejection through a substantially symmetrical arrangement of component parts along the primary path of current flow. Some embodiments of the current shunt sensors achieve improved electromagnetic cross-talk rejection by symmetrical configurations that, in operation, induce complementary parasitic currents or voltages that substantially cancel each other out and do not substantially affect primary current flow through the current shunt sensor.

7 Claims, 10 Drawing Sheets

SHUNT SENSOR AND SHUNT SENSOR ASSEMBLY

FIELD OF THE INVENTION

The present invention relates to the field of electricity distribution and measurement.

BACKGROUND

Electricity is a primary power source used in residential and commercial applications. Electricity is generally transmitted as alternating current. Electricity can be supplied as single-phase or single-phase/split-phase or poly-phase (i.e. multiphase). In single-phase or poly-phase electricity distribution systems, each phase supplied generally requires a separate power line. However, a single-phase/split-phase electricity distribution system typically includes a three-wire configuration on the load side of a distribution transformer. The three wires include two live conducting wires and a mid-point neutral wire (i.e. earth ground). The single-phase/split-phase electricity distribution system is commonly used in North America for single-family residential and light commercial applications.

Measuring the amount of electricity drawn is useful for determining how much to charge a user and for planning future capacity requirements. Electricity is generally measured in terms of an amount of total energy consumed. Total energy consumption generally involves the integration of power used over a specified period of time. Power (P) is the product of voltage (V) and current (I). Electricity meters generally measure total power consumed by measuring the product of the voltage and the current at a given instant in time and accumulating (e.g. integrating) that product over time.

One way to measure current is by using a current shunt. A current shunt generally includes a relatively small-value resistor which is placed in series with a load. Current flows through the current shunt creating a voltage drop across the shunt. A voltage meter or electronic device capable of acquiring the voltage is used to measure the voltage drop, which is used to calculate the current. However, conventional current shunts are not preferred for single-phase/split-phase or poly-phase power measurement, or generally where two or more shunt current sensors are required, for a number of reasons. Current shunts are not isolated from power lines. Consequently, in power metering, sensed phase-to-phase or phase-to-neutral voltage differences produced on the input pins of a metering device can easily exceed maximum levels allowed in standard semiconductor products. Conventional current shunts also need to be electromagnetically isolated from one another to inhibit electromagnetic coupling that sometimes prevents accurate single-phase/split-phase or poly-phase current measurements due to magnetic crosstalk between shunt sensor elements. Achieving substantial magnetic isolation typically requires surrounding each current shunt with a shielding material. But the shielding material makes metering equipment heavy and more expensive. The shielding material can also cause undesirable phase shifts between current and voltage on each shunt that requires compensation and reduces measurement accuracy. Thus, while current shunts are often less expensive, current transformers and Rogowski coils are preferred for commercial single-phase/split-phase and poly-phase metering applications.

SUMMARY

Various embodiments of systems, methods and devices within the scope of the appended claims each have several aspects, no single one of which is solely responsible for the desirable attributes described herein. Without limiting the scope of the appended claims, some prominent features are described herein. After considering this discussion, and particularly after reading the section entitled "Detailed Description" one will understand how the features of various embodiments are used to configure current shunt sensors and current shunt sensor assemblies to have improved electromagnetic cross-talk rejection.

The present disclosure describes configurations for current shunt sensors and current shunt sensor assemblies having improved electromagnetic cross-talk rejection that can be used for single-phase/split-phase and poly-phase power measurement. Some embodiments of the current shunt sensors and current shunt sensor assemblies reduce the need for a shielding material around current shunt sensors in single-phase/split-phase and poly-phase power measurement applications.

Some embodiments of the current shunt sensors achieve improved electromagnetic cross-talk rejection through a substantially symmetrical arrangement of component parts along the primary path of current flow in single-phase/split-phase and poly-phase power measurement applications. Some embodiments of the current shunt sensors achieve improved electromagnetic cross-talk rejection by symmetrical configurations that, in operation, induce complementary parasitic currents or voltages that substantially cancel each other out and do not substantially affect primary current flow through the current shunt sensor in single-phase/split-phase and poly-phase power measurement applications.

For example, in an embodiment, a current shunt sensor is configured to include two sets of measurement connections that are substantially symmetrically placed on opposite sides of a centrally located lengthwise axis of the current shunt sensor. In another embodiment, a current shunt sensor includes a single set of measurement connections that are substantially symmetrically placed on a centrally located lengthwise axis of the current shunt sensor, such that the lengthwise axis defines in part a substantially planar surface. In an embodiment, a current shunt sensor is configured to be substantially symmetrical along a centrally located lengthwise axis corresponding to the primary path of current flow. In an embodiment, a current shunt mount is configured to be substantially symmetrical along a centrally located lengthwise axis and substantially symmetrical along a second axis perpendicular to the lengthwise axis, wherein the lengthwise axis and the second axis at least in part define a planar surface.

In an embodiment, a current shunt sensor assembly includes two or more current shunt sensors, each having a respective lengthwise axis and arranged so that the respective lengthwise axis of each of the current shunt sensors are parallel to one another. In an embodiment, the current shunt sensor assembly includes a substantially planar surface at least partially defined by the respective lengthwise axis. In an embodiment, the current shunt sensor assembly is further arranged within a metering device, such as, but not limited to, a power meter.

DETAILED DESCRIPTION

Figure 1:
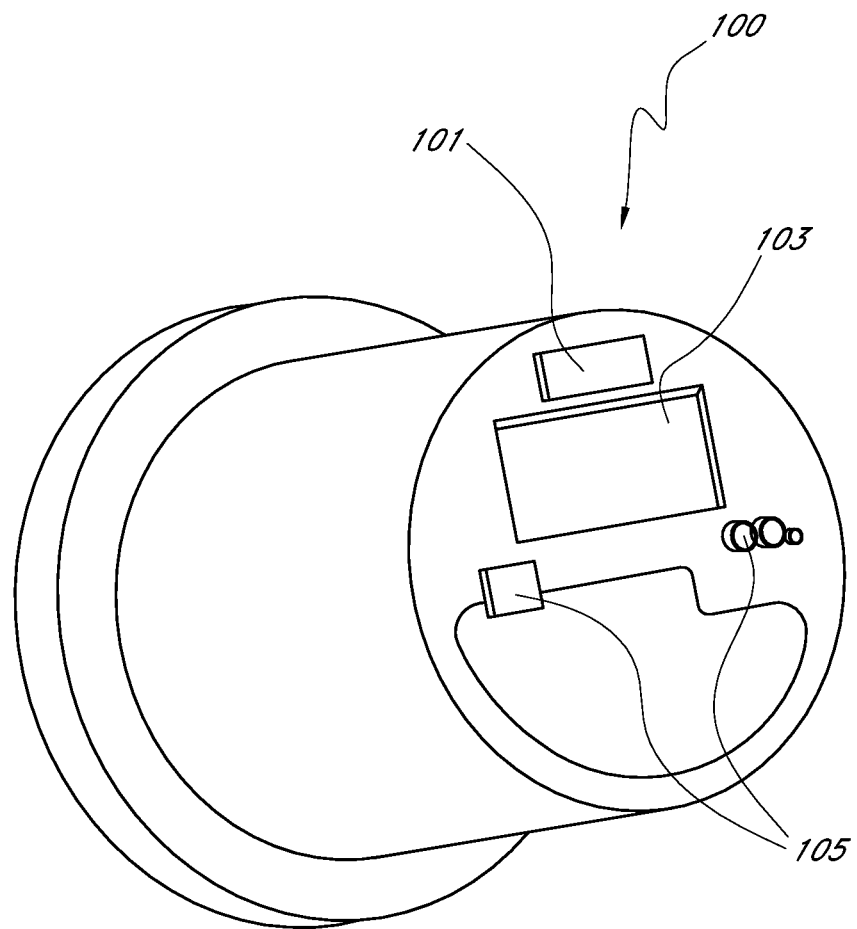
FIG. 1 is an illustration of a power meter with a display.

FIG. 1 illustrates an embodiment of a power meter 100 with display elements 101, 103 and controls 105, such as, for example, buttons, knobs, inputs, outputs, or the like. In an embodiment, the power meter 100 houses a system for measuring single-phase/split-phase and/or poly-phase power.

Figure 2:
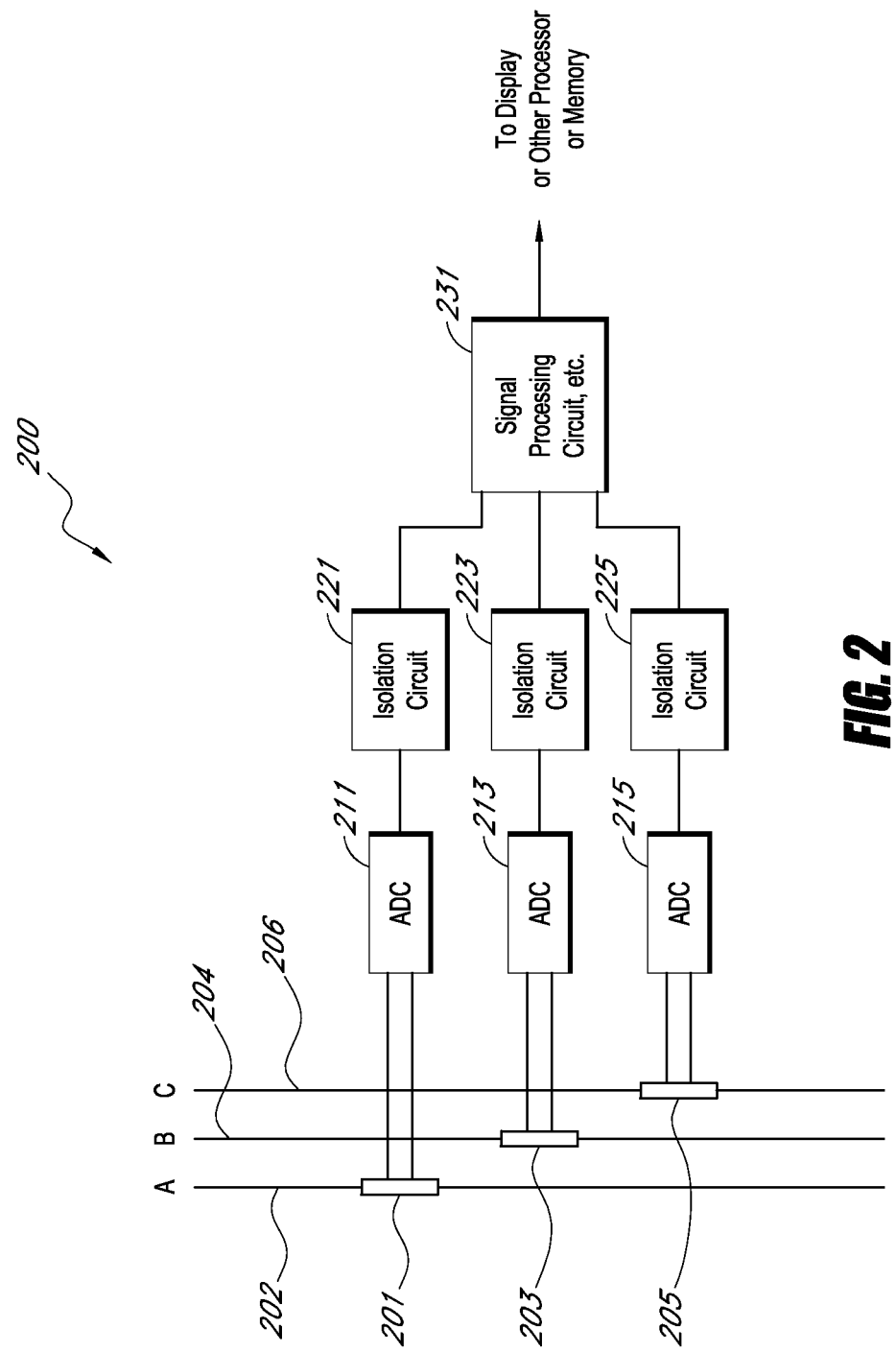
FIG. 2 is a simplified block diagram of a power measurement system that can be configured either for single-phase/split-phase or poly-phase power measurement.

FIG. 2 is a simplified block diagram of a system 200 for measuring single-phase/split-phase and/or poly-phase power that can be embodied within a power meter, such as the power meter 100 illustrated in FIG. 1. Those skilled in the art will appreciate that a system for measuring single-phase/split-phase and/or poly-phase power typically includes more features than are illustrated in FIG. 2. For the sake of brevity, only the more prominent features useful for describing various aspects of embodiments of systems, methods and devices within the scope of the appended claims are illustrated. To that end, the system 200 includes first, second and third current shunt sensors 201, 203, 205 and corresponding first, second and third analog-to-digital converters (ADC) 211, 213, 215. The system 200 also includes first, second and third isolation circuits 221, 223, 225 and a signal processor 231.

The first, second and third current shunt sensors 201, 203, 205 are respectively connectable in series with first, second and third power lines 202, 205, 206. The first, second, and third current shunt sensors 201, 203, 205 are also respectively connectable to the corresponding first, second and third ADCs 211, 213, 215. The first, second and third ADCs 211, 213, 215 are in turn respectively connectable to the corresponding first, second and third isolation circuits 221, 223, 225. The first, second and third isolation circuits 221, 223, 225 are in turn connectable to the signal processor 231.

In one embodiment, the first, second and third isolation circuits 221, 223, 225 each include a high-frequency transformer, such as a pulse transformer. The high-frequency transformer electrically isolates the signal processor 231 from the first, second and third ADCs 211, 213, 215. In one embodiment, a capacitor is used to provide isolation in addition to the high-frequency transformer or instead of the high-frequency transformer.

In operation, the first, second and third power lines 202, 204, 206 each carry a respective current phase. Thus, in the present example, the three power lines 202, 204, 206 combine to carry triple-phase or three-phase electricity. The respective current phase flowing through each of the first, second and third power lines 202, 204, 206 also flows through the corresponding one of the first, second and third current shunt sensors 201, 203, 205. A respective voltage drop proportional to the respective current running through each power line 202, 204, 206 is produced across the first, second and third current shunt sensors 201, 203, 205. That is, each current shunt sensor 201, 203, 205 generates a voltage signal that is proportional to one of the corresponding current phases flowing on the respective first, second and third power lines 202, 204, 206.

The respective voltage signals are transmitted to the corresponding ADCs 211, 213, 215, respectively. Each ADC 211, 213, 215 converts a respective one of the voltage signals into a respective digital value or digital stream of values. The respective digital values or digital streams of values are respectively transmitted through the corresponding first, second and third isolation circuits 221, 223, 225 to the signal processor 231. The signal processor 231 uses the respective digital values or digital streams of values to calculate the power consumption for each of the three phases or the total power consumption of all three phases.

In order to accurately measure and calculate the power consumption for individual phases or all three phases, the current shunt sensors 201, 203, 205 need to be electromagnetically isolated from one another. Electromagnetic isolation reduces the amount of phase-to-phase interference or cross-talk induced between the current shunt sensors 201, 203, 205. This is typically done by surrounding each current shunt sensor with a shielding material. However, the shielding material makes metering equipment heavy and more expensive. The shielding material can also cause undesirable phase shifts between the current and voltage on each current shunt sensor 201, 203, 205 that reduces measurement accuracy. So while current shunts are generally less expensive on their own, due to the aforementioned isolation issues, current transformers and Rogowski coils are preferred for commercial single-phase/split-phase and poly-phase metering applications.

Figure 3:
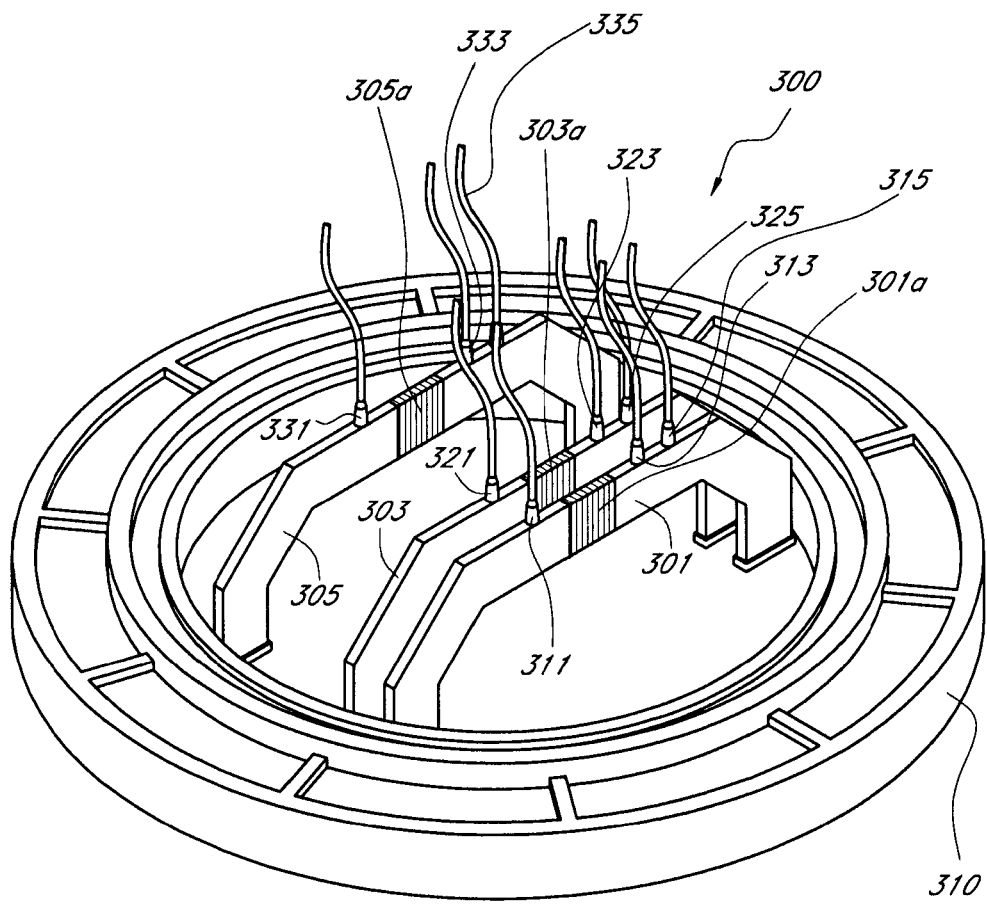
FIG. 3 is a simplified perspective view of a conventional current shunt sensor assembly integrated within a portion of the housing of a power meter.

The electromagnetic isolation and cross-talk problems associated with conventional current shunt sensors are described in greater detail with reference to FIGS. 3 and 4A-B as follows. FIG. 3 is a simplified perspective view of a conventional current shunt sensor assembly 300 integrated within a portion of the housing 310 of a power meter (e.g. see FIG. 1). Those skilled in the art will appreciate that a current shunt sensor assembly for measuring single-phase/split-phase and/or poly-phase power will typically include more features than are illustrated in FIG. 3. For the sake of brevity, only the more prominent features useful for describing various aspects of embodiments of systems, methods and devices within the scope of the appended claims are illustrated in FIG. 3. To that end, the assembly 300 includes a portion of the meter housing 310 and first, second and third current shunt sensors 301, 303, 305. The first, second and third current shunt sensors 301, 303, 305 are integrally arranged into the portion of the meter housing 310.

The first, second and third current shunt sensors 301, 303, 305 are substantially identical to one another. The first current shunt sensor 301 includes a respective shunt resistor 301a and first, second and third measurement connections 311, 313 and 315. The first and second measurement connections 311, 313 are located on either side of the shunt resistor 301a, so that the first and second measurement connections 311, 313 can be used to measure voltage across the shunt resistor 301a. The third measurement connection 315 is located on the same side of the shunt resistor 301a as the second measurement connection 313. Similarly, the second current shunt sensor 303 includes a respective shunt resistor 303a and first, second and third measurement connections 321, 323 and 325. The first and second measurement connections 321, 323 are located on either side of the shunt resistor 303a, so that the first and second measurement connections 321, 323 can be used to measure voltage across the shunt resistor 303a. The third measurement connection 325 is located on the same side of the shunt resistor 303a as the second measurement connection 323. Similarly, the third current shunt sensor 305 includes a respective shunt resistor 305a and first, second and third measurement connections 331, 333 and 335. The first and second measurement connections 331, 333 are located on either side of the shunt resistor 305a, so that the first and second measurement connections 331, 333 can be used to measure voltage across the shunt resistor 305a. The third measurement connection 335 is located on the same side of the shunt resistor 305a as the second measurement connection 333.

As noted above, each of the current shunt sensors 301, 303, 305 includes a respective shunt resistor 301a, 303a, 305a. For electricity meters, shunt resistor values are typically in the range of 120 $\mu\Omega$ to 500 $\mu\Omega$. Shunt resistances as low as or lower than 100 $\mu\Omega$ can also be used in order to reduce the power consumed by the resistors within the metering device. Shunt resistance values can be much higher for general power metering equipment. The foregoing shunt resistance values are provided for context purposes and are not intended to be limiting. As those of skill in the art will understand from the present disclosure, various resistance values can be used.

In the assembly 300 shown in FIG. 3A, the use of shunt resistors with resistance values in the low micro-Ohm ($\mu\Omega$) range is hampered by phase-to-phase electromagnetic cross-talk induced between the current shunt sensors 301, 303, 305 in use. Electromagnetic cross-talk is the induction of a parasitic current or voltage in a conductive element caused by a time-varying electromagnetic field originating from another conductive element in relatively close proximity. For example, a 200 Amp current flowing in a 50 $\mu\Omega$ shunt resistor can induce a parasitic current of approximately 1 Amp in an adjacent shunt resistor approximately 1" away.

With reference to FIG. 3, in operation, first, second and third current phases flow through the corresponding first, second and third current shunt sensors 301, 303, 305. As a result, a respective time-varying electromagnetic field is emitted from each of the first, second and third current shunt sensors 301, 303, 305. Each electromagnetic field induces respective parasitic currents (i.e. the cross-talk) in the two non-origin current shunt sensors. Generally, in an assembly including two or more current shunt sensors, a matrix of electromagnetic interactions is established during operation as respective currents flow through the current shunt sensors. For example, as a first order approximation, the time-varying electromagnetic field emitted from the first current shunt sensor 301 induces respective parasitic currents in the second and third current shunt sensors 303, 305. Similarly, the time-varying electromagnetic field emitted from the second current shunt sensor 303 induces respective parasitic currents in the first and third current shunt sensors 301, 305. Similarly, the time-varying electromagnetic field emitted from the third current shunt sensor 301 induces respective parasitic currents in the first and second current shunt sensors 301, 303. The at least six aforementioned parasitic currents reduce the accuracy of metering operations.

Generally, an electromagnetic field dissipates and gets weaker as the distance from the source of the electromagnetic field increases. In turn, stronger parasitic currents are induced in conductive elements closer to an electromagnetic source than those that are further away. For example, the respective parasitic current induced in the third current shunt sensor 305 by the electromagnetic field originating from the first current shunt sensor 301 will be substantially smaller than the respective parasitic current induced in the second current shunt sensor 303 by the same electromagnetic field, because, as illustrated, the third current shunt sensor 305 is further away from the first current shunt sensor 301 than the second current shunt sensor 303.

Figure 4A:
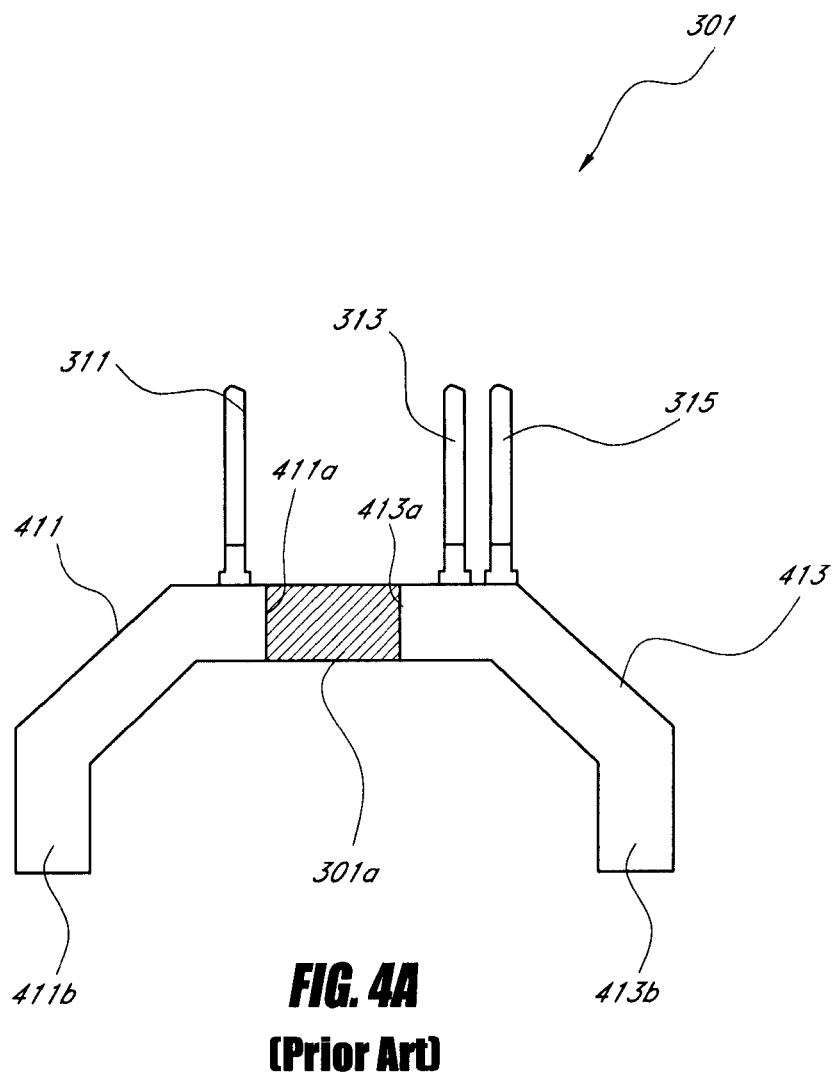
FIG. 4A is a simplified illustration of a conventional current shunt sensor.

FIG. 4A is a simplified isolated side view of the first current shunt sensor 301 shown in FIG. 3. Again, the first current shunt sensor 301 includes the respective shunt resistor 301a and the first, second and third measurement connections 311, 313 and 315. The first current shunt sensor 301 also includes first and second conductive mounting elements 411, 413. The first conductive mounting element 411 has first and second ends 411a, 411b. Similarly, the second conductive mounting element 413 has first and second ends 413a, 413b. The shunt resistor 301a and the first and second conductive mounting elements 411, 413 create a U-shaped side-profile in combination. The first and second conductive mounting elements 411, 413 hold the shunt resistor 301a and provide electrical contacts to the first, second and third measurement connections 311, 313, 315. Specifically, the shunt resistor 301a is between the first end 411a of the first conductive mounting element 411 and the first end 413a of the second conductive mounting element 413. The first measurement connection 311 is coupled to the first conductive mounting element 411, and the second and third measurement connections 313, 315 are coupled to the second conductive mounting element 413.

In operation, the current shunt sensor 301 forms a series path for current flowing in a power line (not shown). To that end, the power line is severed into first and second portions, and the current shunt sensor 301 is connected between the first and second portions to provide an electrical path connecting the first and second portions. Specifically, the second end 411b of the first conductive mounting element 411 is connected to the first portion of the severed power line, and the second end 413b of the second conductive mounting element 413 is connected to the second portion of the severed power line. Accordingly, in operation, current flows through the current shunt sensor 301 entering/exiting the second end 411b of the first conductive mounting element 411 and exiting/entering the second end 413b of the second conductive mounting element 413. Regardless of the polarity, current flows through the shunt resistor 301a in operation. As a result, the shunt resistor 301a causes a voltage drop which is measured using a suitable combination of the first, second and third measurement connections 311, 313, 315.

The measurement connections 311, 313, 315, include conductive elements (e.g. wires), which in combination with the shunt resistor 301a and portions of the first and second conductive mounting elements 411, 413 create a parasitic electromagnetic coupler. The parasitic electromagnetic coupler is at least partially responsible for the induction of parasitic currents or voltages in the current shunt sensor 301. FIG. 4B is a simplified illustration of the parasitic electromagnetic coupler 430 on the conventional current shunt sensor 301. The parasitic electromagnetic coupler 430 includes an area substantially bordered by at least the shunt resistor 301 and the conductive elements of the first and second measurement connections 311, 313 (which have been simplified as lines in FIG. 4B).

Figure 4B:
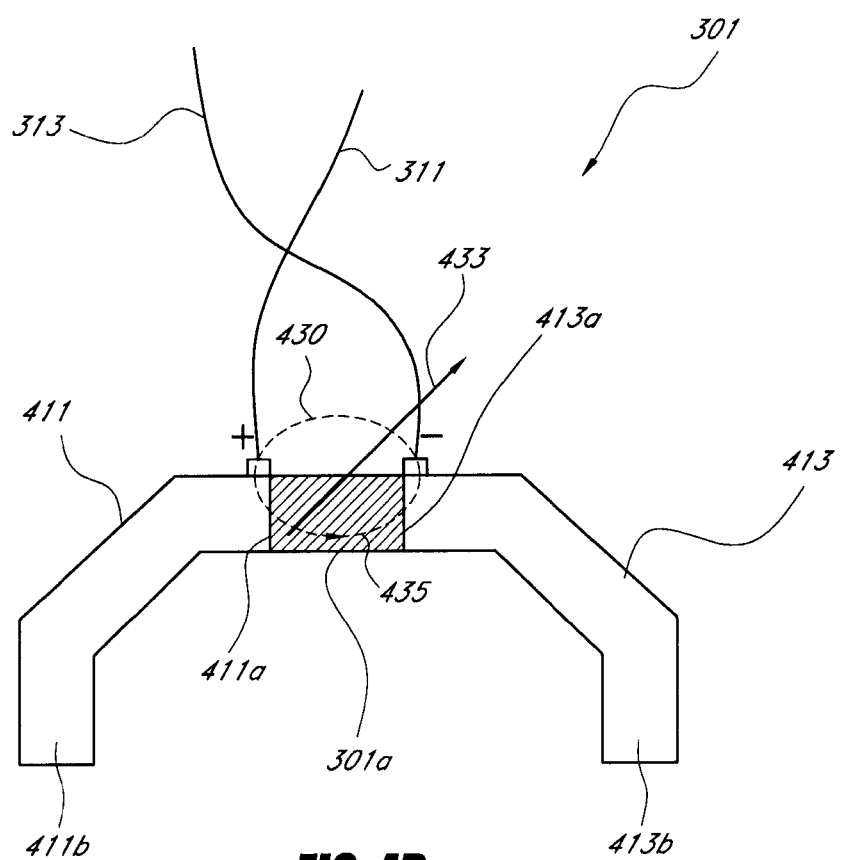
FIG. 4B is a simplified illustration of a parasitic electromagnetic coupler in the conventional current shunt sensor of FIG. 4A.

With reference to both FIG. 3 and FIG. 4B, in operation, the respective time-varying electromagnetic fields, generally indicated by 433 in FIG. 4B, emitted from the second and third current shunt sensors 303, 305 pass through the area defined by the parasitic electromagnetic coupler 430. The elements of the respective time-varying electromagnetic fields that are substantially perpendicular to the direction of current flow in the first current shunt sensor 301 induce a parasitic current 435 within at least the shunt resistor 301a according to Faraday's Law of Induction. Faraday's Law of Induction (also known as the "Maxwell-Faraday" equation) can be written as equation (1) below.

$$V = -n d\phi/dt = -nA \cdot dB/dt \quad (1)$$

In equation (1): n is a number of conductive windings within an electromagnetic field (which is typically 1); A is the area within parasitic electromagnetic coupler 430; and, Φ is the magnetic flux which is the product of the magnetic induction B and the area A. Alternatively, Faraday's Law of Induction can also be written as equation (2) below.

$$\oint_{ds} E \cdot dl = -\frac{\partial \phi_{B.S}}{\partial t} \quad (2)$$

In equation (2): $\oint_{ds} E \cdot dl$ is the line integral of the electric field along the boundary δS of a surface S, which corresponds to the border of the parasitic electromagnetic coupler 430. Both equations (1) and (2) can be used to ultimately determine the induced parasitic current 435. The parasitic current 435 reduces the accuracy of voltage measurements corresponding to the primary current flowing through the current shunt sensor 301 from the power line. However, the induced parasitic current 435 depends on the geometry of the conductive elements 311, 313 extending from the first and second conductive mounting elements 411, 413. As such, the area defined by the parasitic electromagnetic coupler 430 varies depending on how precisely one current shunt assembly is manufactured relative to others. In turn, it is difficult to accurately compensate for the induced parasitic current 435 in operation because the induced current will vary according to unpredictable manufacturing variations and shifting of conductive elements 311, 313 post-manufacturing.

Figure 5:
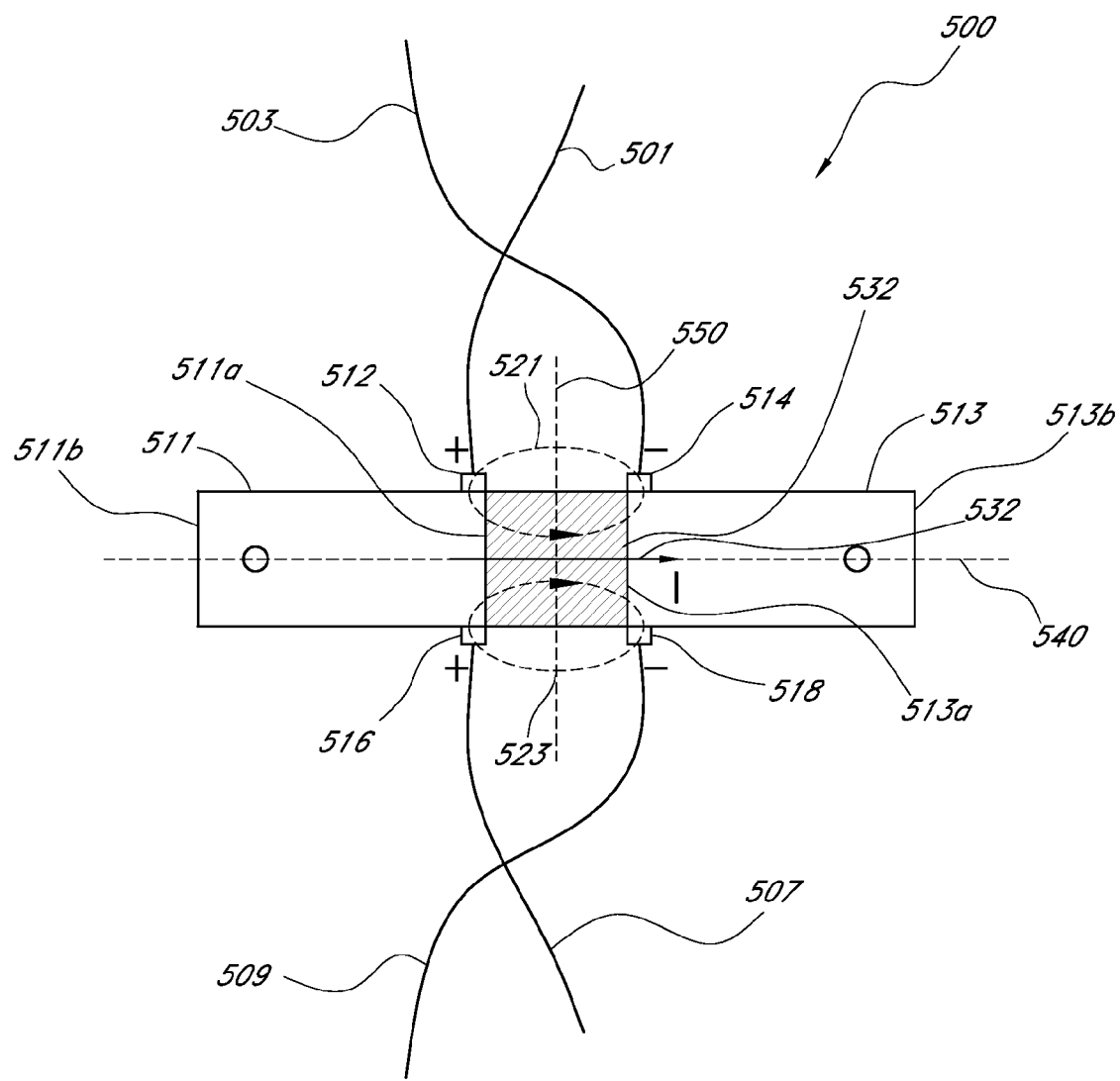
FIG. 5 is a simplified illustration of an embodiment of a current shunt sensor configured to have improved electromagnetic cross-talk rejection.

FIG. 5 is a simplified illustration of a side view of an embodiment of a current shunt sensor 500 configured to have improved electromagnetic cross-talk rejection. The current shunt sensor 500 includes a shunt resistor 530 connected between first and second conductive mounting elements 511, 513. The shunt resistor 530 and the first and second conductive mounting elements 511, 513 form a planar surface defined in part by a central lengthwise axis 540, and a second axis 550 substantially perpendicular to the lengthwise axis 540.

The first conductive mounting element 511 has first and second ends 511a, 511b. Similarly, the second conductive mounting element 513 has first and second ends 513a, 513b. The shunt resistor 530 is held between the first end 511a of the first conductive mounting element 511 and the first end 513a of the second conductive mounting element 513.

The first and second conductive mounting elements 511, 513 also provide four measurement connections 512, 514, 516, 518. The four measurement connections 512, 514, 516, 518 are substantially symmetrically located on opposite sides of the centrally located lengthwise axis 540 and substantially symmetrically located on opposite sides of the second axis 550. Specifically, the first measurement connection 512 is located on one portion of the first end 511a of the first conductive mounting element 511 and the third measurement connection 516 is located on an opposite portion of the first end 511a, so that the first and third measurement connections 512, 516 are substantially equidistant from the central lengthwise axis 540. Similarly, the second measurement connection 514 is located on one portion of the first end 513a of the second conductive mounting element 513 and the fourth measurement connection 518 is located on an opposite portion of the first end 513a, so that the second and fourth measurement connections 514, 518 are substantially equidistant from the central lengthwise axis 540. The first and second measurement connections 512, 514 are located on opposite ends of the shunt resistor 530, and thus substantially equidistant from the second axis 550. Similarly, the third and fourth measurement connections 516, 518 are located on opposite ends of the shunt resistor 530, and thus substantially equidistant from the second axis 550.

The first measurement connection 512 is coupled to a conductive element, such as a wire 501, which is ultimately coupled to a voltmeter. Similarly, the second measurement connection 514 is coupled to a conductive element, such as a wire 503. Similarly, the third measurement connection 516 is coupled to a conductive element, such as a wire 507. Similarly, the fourth measurement connection 518 is coupled to a conductive element, such as a wire 509. Wires 501 and 507 are ultimately coupled in parallel with one another and provided to one input of a voltmeter (not shown). Similarly, wires 503 and 509 are ultimately coupled in parallel with one another and provided to another input of the voltmeter.

The first and second measurement connections 512, 514 in combination with the shunt resistor 530, wires 501, 503 and portions of the first and second conductive mounting elements 511, 513 create a first parasitic electromagnetic coupler 521. The third and fourth measurement connections 516, 518 in combination with the shunt resistor 530, wires 507, 509 and portions of the first and second conductive mounting elements 511, 513 create a second parasitic electromagnetic coupler 523.

In some embodiments, the shunt resistor 530 is a Manganin resistor. Manganin is an alloy primarily including copper, manganese and nickel, which is useful for manufacturing accurate resistors that remain stable for a long time and are useful for current measurement. Manganin resistors are often low cost components, which in turn, lowers the relative cost the current shunts sensors. In some embodiments, a resistor made from Constantan, another useful alloy, is used for shunt resistor 530.

In operation, the current shunt sensor 500 forms a series path for current 532 flowing in a power line (not shown). To that end, the power line is severed into first and second portions, and the current shunt sensor 500 is connected between the first and second portions to provide an electrical path connecting the first and second portions. Specifically, the second end 511b of the first conductive mounting element 511 is connected to the first portion of the severed power line, and the second end 513b of the second conductive mounting element 513 is connected to the second portion of the severed power line. Accordingly, in operation, the current 532 flows through the current shunt sensor 500 entering/exiting the second end 511b of the first conductive mounting element 511 and exiting/entering the second end 513b of the second conductive mounting element 513. Regardless of the polarity, the current 532 flows through the shunt resistor 530 in operation. As a result, the shunt resistor 530 causes a voltage drop which is measured using a suitable combination of the four measurement connections 512, 514, 516, 518.

Also in operation, the first and second parasitic electromagnetic couplers 521, 523 purposefully induce parasitic currents within the current shunt sensor 500. However, because the first and second parasitic electromagnetic couplers 521, 523 are substantially mirror images of one another, the respective parasitic current each induces is approximately opposite of the respective parasitic current induced by the other. As a result, the respective parasitic currents substantially cancel each other out, thereby improving the measurement accuracy of the current 532.

Figure 6:
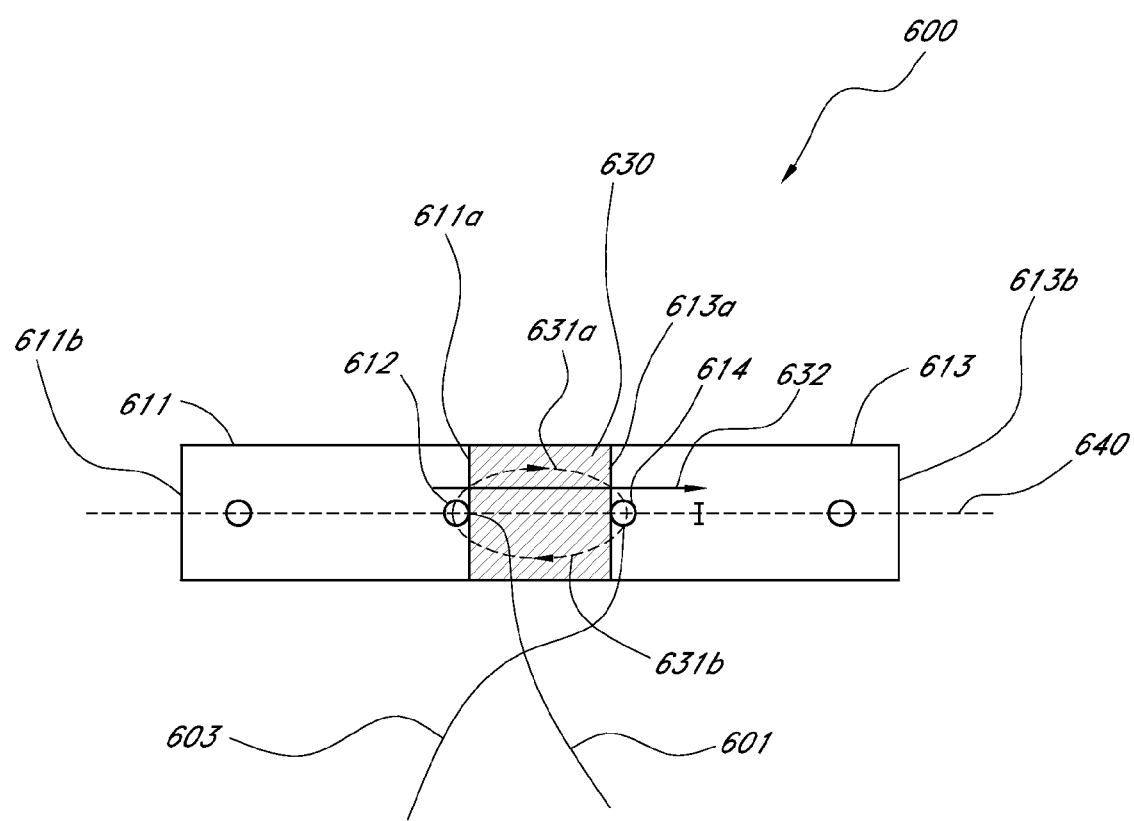
FIG. 6 is a simplified illustration of another embodiment of a current shunt sensor configured to have improved electromagnetic cross-talk rejection.

FIG. 6 is a simplified illustration of a side view of another embodiment of a current shunt sensor 600 configured to have improved electromagnetic cross-talk rejection. The current shunt sensor 600 includes a shunt resistor 630 connected between first and second conductive mounting elements 611, 613. The current shunt sensor 600 is bi-directional. Either the first or the second conductive mounting element can be used as the input, with the other serving as the respective output (and vice versa). In other words, the direction of current flow through the current shunt sensor 600 can be reversed without substantially impacting the operation of the current shunt sensor 600 (although components connected to the current shunt sensor 600 may be affected by changes in the direction of current flow). The shunt resistor 630 and the first and second conductive mounting elements 611, 613 are connected together to form a planar surface defined in part by a central lengthwise axis 640.

The first conductive mounting element 611 has first and second ends 611a, 611b. Similarly, the second conductive mounting element 613 has first and second ends 613a, 613b. The shunt resistor 630 is fixed between the first end 611a of the first conductive mounting element 611 and the first end 613a of the second conductive mounting element 613.

The first and second conductive mounting elements 611, 613 also provide electrical contacts to first and second measurement connections 612, 614. The first and second measurement connections 612, 614 are substantially symmetrically located on the centrally located lengthwise axis 640 on opposite ends of the shunt resistor 630. Specifically, the first measurement connection 612 is located substantially at the first end 611a of the first conductive mounting element 611 on the centrally located lengthwise axis 640. Similarly, the second measurement connection 614 is located at the first end 613a of the second conductive mounting element 613 on the centrally located lengthwise axis 640.

The first measurement connection 612 is coupled to a conductive element, such as a wire 601, which is ultimately coupled to a voltmeter. Similarly, the second measurement connection 614 is coupled to a conductive element, such as a wire 603. The first and second measurement connections 612, 614 in combination with the shunt resistor 630, wires 601, 603 and portions of the first and second conductive mounting elements 611, 613 create first and parasitic electromagnetic couplers 631a, 631b.

In some embodiments, the shunt resistor 630 is a Manganin resistor. Manganin is an alloy primarily including copper, manganese and nickel, which is useful for manufacturing accurate resistors that remain stable for a long time and are useful for current measurement. Manganin resistors are often low cost components, which in turn, lowers the relative cost the current shunts sensors. In some embodiments, a resistor made from Constantan, another useful alloy, is used for shunt resistor 630.

In operation, the current shunt sensor 600 forms a series path for current 632 flowing in a power line (not shown). To that end, the power line is severed into first and second portions, and the current shunt sensor 600 is connected between the first and second portions to provide an electrical path connecting the first and second portions. Specifically, the second end 611b of the first conductive mounting element 611 is connected to the first portion of the severed power line, and the second end 613b of the second conductive mounting element 613 is connected to the second portion of the severed power line. Accordingly, in operation, the current 632 flows through the current shunt sensor 600 entering/exiting the second end 611b of the first conductive mounting element 611 and exiting/entering the second end 613b of the second conductive mounting element 613. Regardless of the polarity, the current 632 flows through the shunt resistor 630 in operation. As a result, the shunt resistor 630 causes a voltage drop which is measured using the first and second measurement connections 612, 614.

Also in operation, the first and second parasitic electromagnetic couplers 631a, 631b induce parasitic currents within the current shunt sensor 600. However, because the first and second parasitic electromagnetic couplers 631a, 631b are substantially mirror images of one another, the respective parasitic current each induces is approximately opposite of the respective parasitic current induced by the other. As a result, the respective parasitic currents substantially cancel each other out, thereby improving the measurement accuracy of the current 632.

Figure 7:
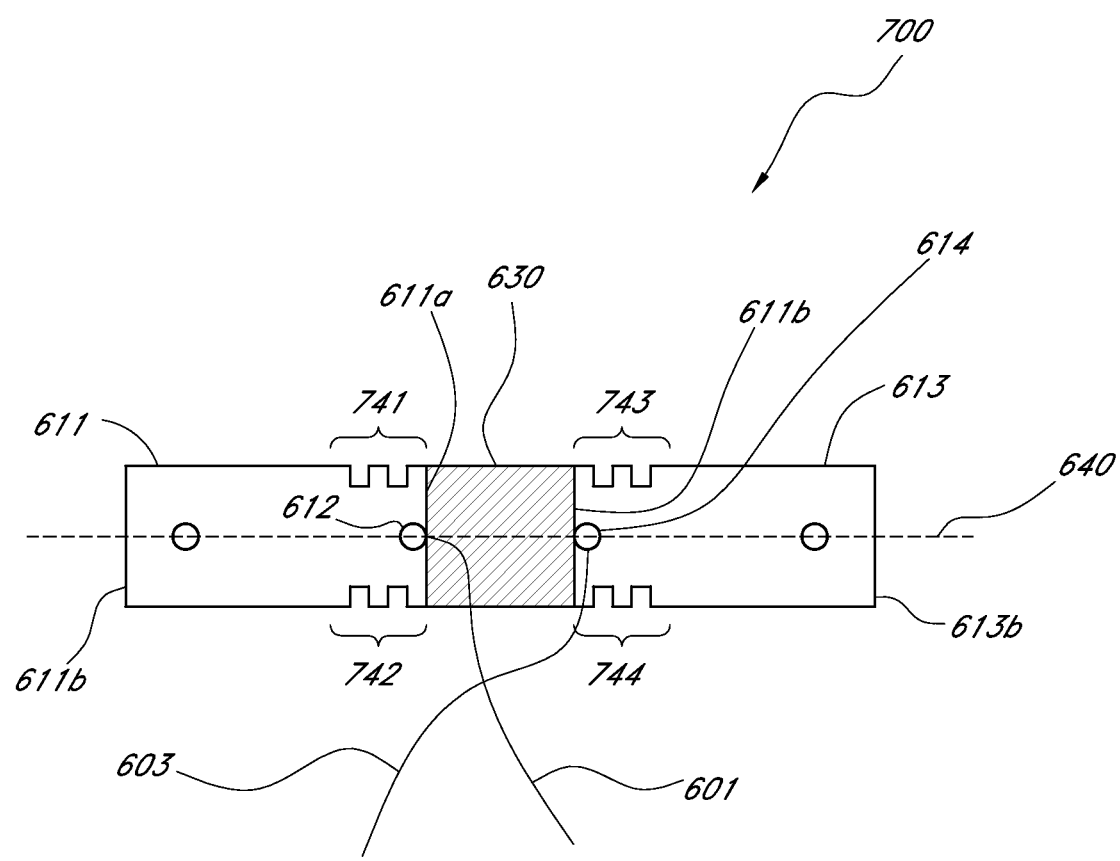
FIG. 7 is a simplified illustration of another embodiment of a current shunt sensor configured to have improved electromagnetic cross-talk rejection.

FIG. 7 is a simplified illustration of a side view of another embodiment of a current shunt sensor 700 configured to have improved electromagnetic cross-talk rejection. The current shunt sensor 700 illustrated in FIG. 7 is similar to and adapted from the current shunt sensor 600 illustrated in FIG. 6. Accordingly, elements common to both current shunt sensors 600 and 700 share common reference indicia, and only differences between the current shunt sensor 600 and 700 are described herein for the sake of brevity. Similar to the current shunt sensor 600, the current shunt sensor 700 is bi-directional, meaning that either the first or the second conductive mounting element can be used as the input, with the other serving as the respective output (and vice versa).

With reference to FIG. 7, the first and second conductive mounting elements 611, 613 also include four notches 741, 742, 743, 744. The four notches 741, 742, 743, 744 are substantially symmetrically located on opposite sides of the centrally located lengthwise axis 740. Specifically, the first notch 741 is located on corner of the first end 611a of the first conductive mounting element 611 and the second notch 742 is located on the other corner of the first end 611a, so that the first and second notches 741, 742 are substantially equidistant from the central lengthwise axis 640. Similarly, the third notch 743 is located on one corner of the first end 513a of the second conductive mounting element 613 and the fourth notch 744 is located on the other corner of the first end 613a, so that the third and fourth notches 743, 744 are substantially equidistant from the central lengthwise axis 640. The first and third notches 741, 743 are located on opposite ends of the shunt resistor 630. Similarly, the second and fourth measurement connections 742, 744 are located on opposite ends of the shunt resistor 630.

Accordingly, the first and second conductive mounting elements 611, 613 substantially mirror one another, and are each symmetric along the central lengthwise axis 640. In operation, the symmetry of the first and second conductive mounting elements 611, 613 aids in cross-talk rejection by lowering the coupling in of stay electromagnetic field elements from other current shunt sensors or other electromagnetic emitters, such as power lines and other conductive elements carrying a time-varying current.

Figure 8:
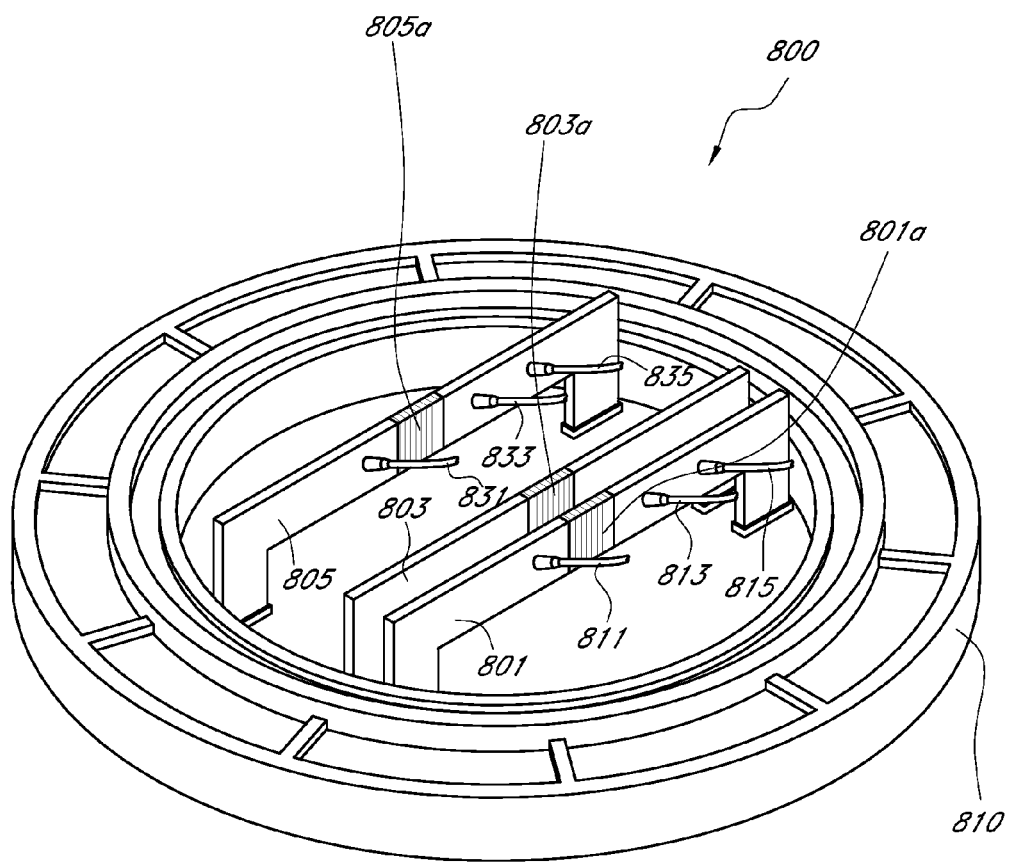
FIG. 8 is a simplified perspective view of an embodiment of a current shunt sensor assembly configured to have improved electromagnetic cross-talk rejection.

FIG. 8 is a simplified perspective view of an embodiment of a current shunt sensor assembly 800 integrated within a portion of the housing 810 of a power meter (e.g. see FIG. 1). Those skilled in the art will appreciate that a current shunt sensor assembly for measuring single-phase/split-phase and/or poly-phase power will typically include more features than are illustrated in FIG. 8. For the sake of brevity, only the more prominent features useful for describing various aspects of embodiments of systems, methods and devices within the scope of the appended claims are illustrated in FIG. 8. To that end, the assembly 800 includes a portion of the meter housing 810 and first, second and third current shunt sensors 801, 803, 805. The first, second and third current shunt sensors 801, 803, 805 are integrally arranged into the portion of the meter housing 810.

The first, second and third current shunt sensors 801, 803, 805 are substantially identical to one another. The first current shunt sensor 801 includes a respective shunt resistor 801a and first, second and third measurement connections 811, 813 and 815. The first and second measurement connections 811, 813 are located on either side of the shunt resistor 801a on a broad planar surface of the current shunt sensor 801, so that the first and second measurement connections 811, 813 can be used to measure voltage across the shunt resistor 801a. The third measurement connection 815 is located on the same side of the shunt resistor 801a as the second measurement connection 813. Similarly, the second current shunt sensor 803 includes a respective shunt resistor 803a and first, second and third measurement connections (not shown for the sake of clarity). Similarly, the third current shunt sensor 805 includes a respective shunt resistor 805a and first, second and third measurement connections 831, 833 and 835. The first and second measurement connections 831, 833 are located on either side of the shunt resistor 805a on a broad planar surface of the current shunt sensor 805, so that the first and second measurement connections 831, 833 can be used to measure voltage across the shunt resistor 805a. The third measurement connection 835 is located on the same side of the shunt resistor 805a as the second measurement connection 833.

As noted above, each of the current shunt sensors 801, 803, 805 includes a respective shunt resistor 801a, 803a, 805a, across which a respective voltage drop is produced during operation. For electricity meters, shunt resistor values are typically in the range of 120 µΩ to 500 µΩ. Shunt resistances as low as 100 µΩ are sometimes used in order to reduce the power consumed by the resistors within the metering device. Shunt resistance values can be much higher for general power metering equipment.

As compared to the assembly 300 shown in FIG. 3A, the use of shunt resistors with resistance values in the low micro-Ohm (µΩ) range in assembly 800 shown in FIG. 8 is not hampered to the same extent by phase-to-phase electromagnetic cross-talk induced between the current shunt sensors 801, 803, 805 in use. The current shunt sensors 801, 803, 805 are configured (as in FIG. 6) to reject electromagnetic cross-talk by each inducing at least two parasitic currents that substantially cancel each other out in operation.

Figure 9:
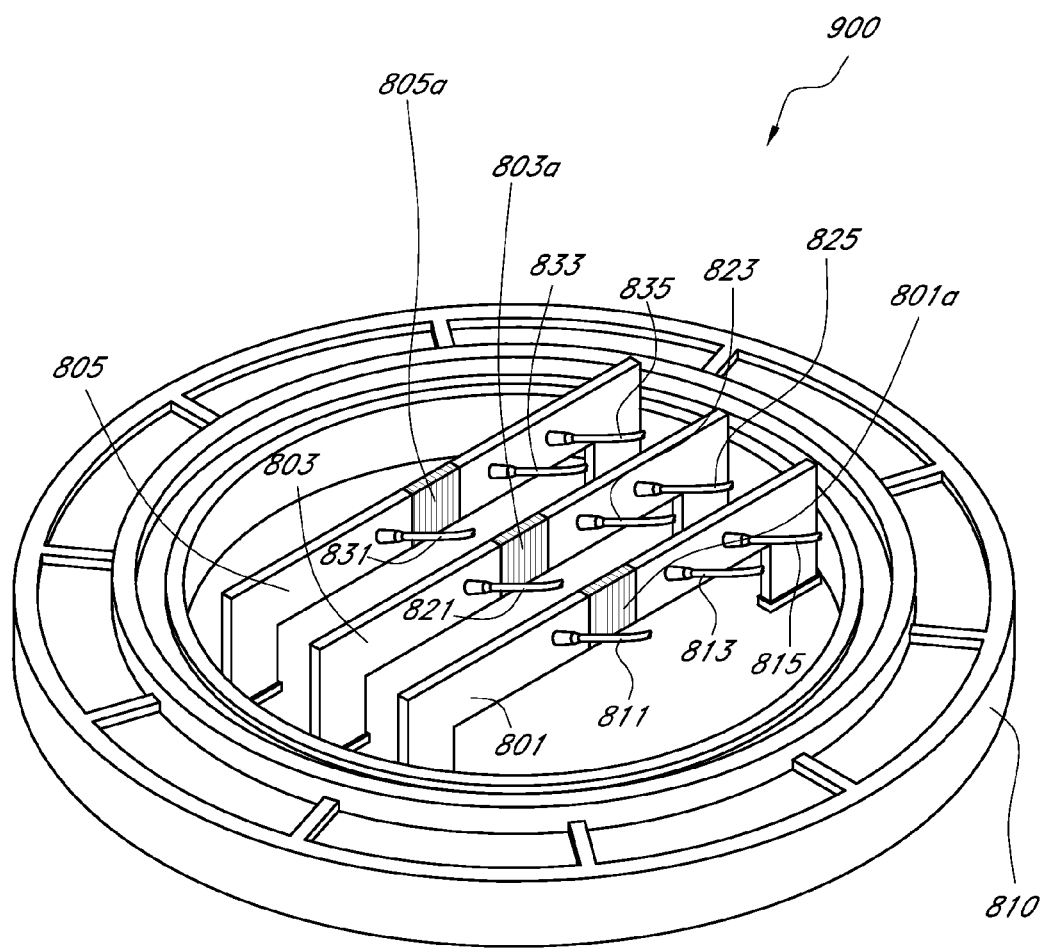
FIG. 9 is a simplified perspective view of another embodiment of a current shunt sensor assembly configured to have improved electromagnetic cross-talk rejection.

FIG. 9 is a simplified perspective view of another embodiment of a current shunt sensor assembly 900 configured to have improved electromagnetic cross-talk rejection. The current shunt assembly 900 illustrated in FIG. 9 is similar to and adapted from the current shunt assembly 800 illustrated in FIG. 8. Accordingly, elements common to both current shunt assemblies 800 and 900 share common reference indicia, and only differences between the current shunt assemblies 800 and 900 are described herein for the sake of brevity.

With reference to FIG. 9, in the current shunt assembly 900 the first, second and third current shunt sensors 801, 803, 805 are substantially equally spaced with respect to one another. As such, the measurement connections 821, 823 and 825 are illustrated on the second current shunt sensor 803.

Those skilled in the art will appreciate from the present disclosure that any combination and arrangement of two or more current shunt sensors, adapted in any of the ways previously disclosed can be provided in a current shunt sensor assembly. In particular, those skilled in the art will appreciate that an individual current shunt sensor can be provided for each respective current phase measured by a power meter, and that each current shunt sensor provided is preferably arranged so that respective lengthwise axis of each is substantially parallel to the other current shunt sensors.

Although the foregoing invention has been described in terms of certain preferred embodiments, other embodiments will be apparent to those of ordinary skill in the art from the disclosure herein. For example, although the description focused on poly-phase sensing applications, those skilled in the art will recognize from the disclosure herein that single-phase and dual-phase sensing are also applications within the scope of the appended claims. Moreover, those skilled in the art will appreciate that the term "poly-phase" is applicable to two or more phases or individual currents in systems with multiple phases that are not necessarily traditional poly-phase systems. For example, such systems may have 120° or 240° voltage phase angle between individual phases or other arbitrary phase angles between individual phases.

Additionally, those skilled in the art will appreciate that the single-phase/split-phase system described by the American National Standards Institute (ANSI) includes a three-wire system in which embodiments of at least two current sensors configured in accordance with aspects of the invention could be advantageously employed. In particular, the ANSI Form 2S is a single-phase/split-phase meter having two current sensors. Each sensor is inserted in series with a 120 VAC line circuit (with respect to mid-point neutral). The two 120 VAC circuits bear a 180° phase relative to each other and together produce a single-phase 240 VAC circuit. Since the single-phase 240 VAC circuit includes two balanced split phases, the term "split-phase" is often used in the art.

Also for example, a skilled artisan will recognize from the disclosure herein that various methods of manufacture, design, and materials can be used to make the various components described herein. Additionally, other combinations, omissions, substitutions and modifications will be apparent to the skilled artisan in view of the disclosure herein. It is contemplated that various aspects and features of the invention described can be practiced separately, combined together, or substituted for one another, and that a variety of combination and sub-combinations of the features and aspects can be made and still fall within the scope of the invention. Furthermore, the systems described above need not include all of the modules and functions described in the preferred embodiments. Accordingly, the present invention is not intended to be limited by the recitation of the preferred embodiments, but is to be defined by reference to the appended claims.

What is claimed is:

1. A current shunt sensor, comprising:
  first and second conductive mounting elements, each having respective first and second ends;
  a resistor between the respective first ends of the first and second conductive mounting elements,
  wherein first surfaces of each of the first and second conducting mounting elements and the resistor are coplanar,
  wherein second surfaces of each of the first and second conducting mounting elements and the resistor are coplanar, wherein the first and second surfaces are opposing surfaces and are defined in part by a central lengthwise axis, wherein the resistor is defined by a second axis substantially perpendicular to the central lengthwise axis and to third and fourth opposing surfaces of each of the first and second conducting mounting elements and the resistor, and wherein the respective first and second ends and the resistor are symmetric along the central lengthwise axis;

first and second measurement connections on the third surfaces of the first and second mounting elements, respectively, on a first side of the central lengthwise axis, and on respective opposing sides of the second axis; and third and fourth measurement connections on the fourth surfaces of the first and second mounting elements, respectively, on a second side of the central lengthwise axis, and on the respective opposing sides of the second axis.

2. The current shunt sensor of claim 1, wherein the first and second measurement connections are equidistant from the second axis, and the third and fourth measurement connections are equidistant from the second axis.

3. The current shunt sensor of claim 1, wherein the resistor comprises at least one of Manganin and Constantin.

4. The current shunt sensor of claim 1, wherein the first and second conductive mounting elements and the resistor are symmetrical along the second axis.

5. The current shunt sensor of claim 1, wherein the third surfaces are coplanar, and wherein the fourth surfaces are coplanar.

6. The current shunt sensor of claim 1, wherein the first and third measurement connections are equidistant from the central lengthwise axis, and wherein the second and fourth measurement connections are equidistant from the central lengthwise axis.

7. The current shunt sensor of claim 1, wherein the first, second, third, and fourth measurement connections are located adjacent to respective corners of the first and second surfaces of the resistor.

* * * * *

UNITED STATES PATENT AND TRADEMARK OFFICE
CERTIFICATE OF CORRECTION

PATENT NO. : 8,493,059 B2
APPLICATION NO. : 12/772034
DATED : July 23, 2013
INVENTOR(S) : Wolfhard J. Homma et al.

It is certified that error appears in the above-identified patent and that said Letters Patent is hereby corrected as shown below:

In the Specifications:

Column 3, Line 46    Delete "205," and insert --204,--

Signed and Sealed this
Tenth Day of December, 2013

Margaret A. Focarino
*Commissioner for Patents of the United States Patent and Trademark Office*